US006756833B2

(12) United States Patent
Miura

(10) Patent No.: US 6,756,833 B2
(45) Date of Patent: Jun. 29, 2004

(54) DELAYED SIGNAL GENERATION CIRCUIT

(75) Inventor: Hiromichi Miura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/162,074

(22) Filed: Jun. 5, 2002

(65) Prior Publication Data

US 2003/0011416 A1 Jan. 16, 2003

(30) Foreign Application Priority Data

Jul. 10, 2001 (JP) ........................................ 2001-209644

(51) Int. Cl.[7] .............................................. H03H 11/26
(52) U.S. Cl. ........................ 327/277; 327/284; 327/294; 326/93
(58) Field of Search ................................ 327/261, 269, 327/271, 276, 277, 284, 291, 293–298, 407; 326/93; 365/233, 233.5

(56) References Cited

U.S. PATENT DOCUMENTS

| 5,245,231 | A | * | 9/1993 | Kocis et al. ................. 327/277 |
| 5,708,382 | A | * | 1/1998 | Park ........................... 327/277 |
| 5,901,190 | A | * | 5/1999 | Lee ............................. 375/373 |
| 6,104,224 | A | * | 8/2000 | Koshikawa .................. 327/277 |
| 6,150,847 | A | * | 11/2000 | Lu .............................. 326/93 |
| 6,222,894 | B1 | * | 4/2001 | Lee ............................. 375/376 |

FOREIGN PATENT DOCUMENTS

JP 11261389 9/1999

* cited by examiner

Primary Examiner—Minh Nguyen
(74) Attorney, Agent, or Firm—Burns, Doane, Swecker & Mathis, L.L.P.

(57) ABSTRACT

A delayed signal generation circuit includes a first delay circuit having a plurality of delay elements connected in series and delaying a reference signal applied thereto, a second delay circuit having a plurality of delay elements connected in series each of which sends out an output signal which is delayed with respect to an input signal applied to the second delay circuit, a detector unit, responsive to the reference signal, for detecting a number of delay elements of the first delay circuit which output an output signal that is delayed with respect to the reference signal after a lapse of a predetermined time interval, and a selection unit for selecting one delay element from the second delay circuit according to the number of delay elements of the first delay circuit, and for outputting the output signal from the selected delay element as a delayed signal.

4 Claims, 8 Drawing Sheets

DELAYED SIGNAL GENERATION CIRCUIT

BACKGROUND OF THE INVENTION

1. Field of the Invention

The present invention relates to a delayed signal generation circuit for generating a delayed signal.

2. Description of the Prior Art

FIG. 8 is a schematic circuit diagram showing the structure of a prior art delayed signal generation circuit. In the figure, reference numeral 1 denotes a delay element for holding an input signal during a predetermined time interval and for outputting an output signal which is delayed by the time interval with respect to the input signal, reference numeral 2 denotes an inverter which constitutes each delay element 1, and reference numeral 3 denotes a capacitor which constitutes each delay element 1.

In operation, since N delay elements 1 are connected in series in the delayed signal generation circuit of FIG. 8, when the delay time caused by each delay element 1 is T, the output signal from the final-stage delay element 1 is delayed by N×T with respect to the input signal applied to the first-stage delay element 1.

A problem with a prior art delayed signal generation circuit constructed as mentioned above is that when a power supply voltage supplied to each delay element 1 decreases or when the operating temperature rises, the switching time of the inverter 2 which constitutes each delay element 1 increases and hence the delay time caused by each delay element 1 increases, and this results in a change in the delay time by which the output signal is delayed with respect to the input signal.

SUMMARY OF THE INVENTION

The present invention is proposed to solve the above-mentioned problem, and it is therefore an object of the present invention to provide a delayed signal generation circuit capable of generating an output signal which is delayed by a constant delay time with respect to an input signal even if the power supply voltage and/or the operating temperature changes.

In accordance with an aspect of the present invention, there is provided a delayed signal generation circuit comprising: a first delay circuit having a plurality of delay elements connected in series, the first delay circuit delaying a reference signal applied thereto; a second delay circuit having a plurality of delay elements connected in series each of which sends out an output signal which is delayed with respect to an input signal applied to the second delay circuit; a detector unit, responsive to the reference signal applied to the first delay circuit, for detecting a number of delay elements of the first delay circuit which send out an output signal that is delayed with respect to the reference signal after a lapse of a predetermined time interval; and a selection unit for selecting one delay element from among the plurality of delay elements of the second delay circuit according to the number of delay elements of the first delay circuit which is detected by the detector unit, and for sending out the output signal from the selected delay element of the second delay circuit as a delayed signal. Accordingly, the delayed signal generation circuit can generate a delayed signal that is delayed by a constant time interval with respect to the input signal even if the power supply voltage and/or the operating temperature changes.

In accordance with another aspect of the present invention, the selection unit stores correspondences between the number of delay elements of the first delay circuit which is detected by the detection unit, and one delay element of the second delay circuit which is to be selected by the selection unit. Accordingly, the delayed signal generation circuit can generate a delayed signal that is delayed by a constant time interval with respect to the input signal without complicating the structure of the delayed signal generation circuit.

In accordance with a further aspect of the present invention, the delayed signal generation circuit further comprises a unit for setting a correspondence between the number of delay elements of the first delay circuit which is detected by the detection unit, and one delay element of the second delay circuit which is to be selected by the selection unit in the selection unit and changing the correspondence stored in the selection unit based on the number of delay elements detected by the detector unit. Accordingly, the delayed signal generation circuit can generate a delayed signal that is delayed by a constant time interval with respect to the input signal even if there are variations in the manufacturing processes.

In accordance with another aspect of the present invention, the delayed signal generation circuit further comprises a unit for reducing a frequency of a clock supplied to the plurality of delay elements of the second delay circuit when the number of delay elements detected by the detector unit is less than a reference number. Accordingly, the delayed signal generation circuit can secure a low voltage margin.

In accordance with a further aspect of the present invention, the delayed signal generation circuit further comprises a unit for outputting an interruption signal that informs a decrease in a power supply voltage when the number of delay elements detected by the detector unit is less than a reference number. Accordingly, the delayed signal generation circuit can give an alarm indicating a decrease in the power supply voltage and can provide an instruction for saving of the contents of a RAM.

In accordance with another aspect of the present invention, the delayed signal generation circuit further comprises a unit for raising a power supply voltage when the number of delay elements detected by the detector unit is less than a reference number. Accordingly, the delayed signal generation circuit can keep the power supply voltage constant.

In accordance with a further aspect of the present invention, the delayed signal generation circuit further comprises a unit for controlling a power supply voltage according to the number of delay elements detected by the detection unit. Accordingly, the delayed signal generation circuit can keep the power supply voltage constant.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1.

Figure 1:
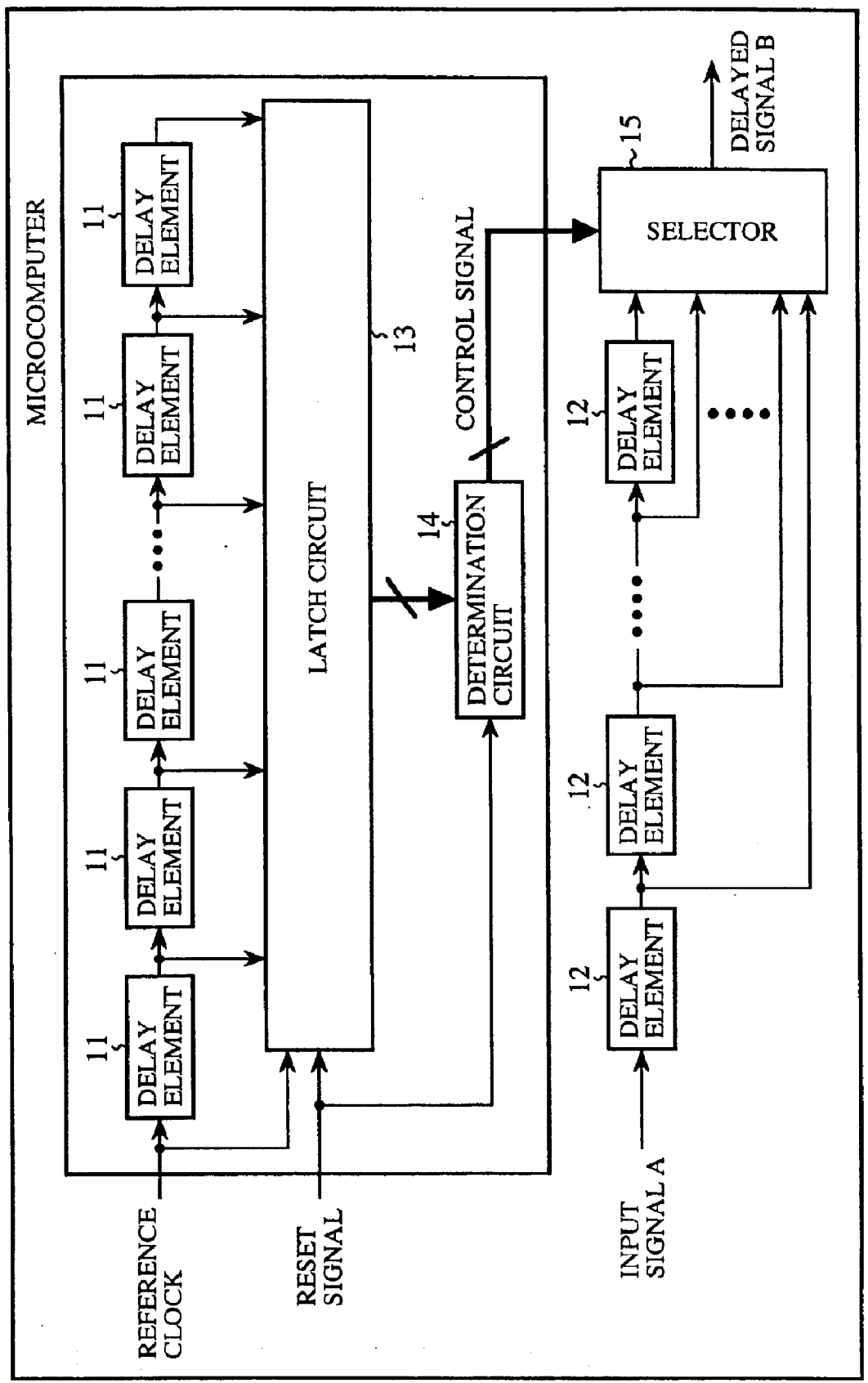
FIG. 1 is a block diagram showing the structure of a delayed signal generation circuit according to a first embodiment of the present invention.

FIG. 1 is a block diagram showing the structure of a delayed signal generation circuit according to a first embodiment of the present invention. In the figure, reference numeral 11 denotes a delay element for outputting a reference clock (e.g., a P1 clock from a microcomputer into which the delayed signal generation circuit is incorporated) which is a reference signal after holding it during a predetermined time interval. A first delay circuit is comprised of N delay elements 11. Reference numeral 12 denotes a delay element for holding a signal A which is an input signal during a predetermined time interval, and for sending out an output signal which is delayed by the predetermined time interval with respect to the input signal. A second delay circuit is comprised of S delay elements 12.

Reference numeral 13 denotes a latch circuit (i.e., detection means) for latching the contents of each delay element 11 every time the reference clock falls, and for clearing the contents thereof every time a reset signal (e.g., a P2 clock from the microcomputer in which the P1 clock and the P2 clock are provided as two-phase clocks which do not overlap with each other) falls, and reference numeral 14 denotes a determination circuit for, every time the reset signal rises, determining the number of delay elements 11 that make a "Low" to "High" transition in their contents during the interval that the reference clock is at a "High" state from the contents of the latch circuit 13, and for outputting a control signal having a value corresponding to the determined number of delay elements 11. Reference numeral 15 denotes a selector (i.e. selection means is 15 an 14) for selecting a delay element 12 according to the control signal output from the determination circuit 14, and for sending out an output signal, which is delayed by a predetermined time interval with respect to the input signal A, from the selected delay element 12, as a delayed signal B.

Figure 8:
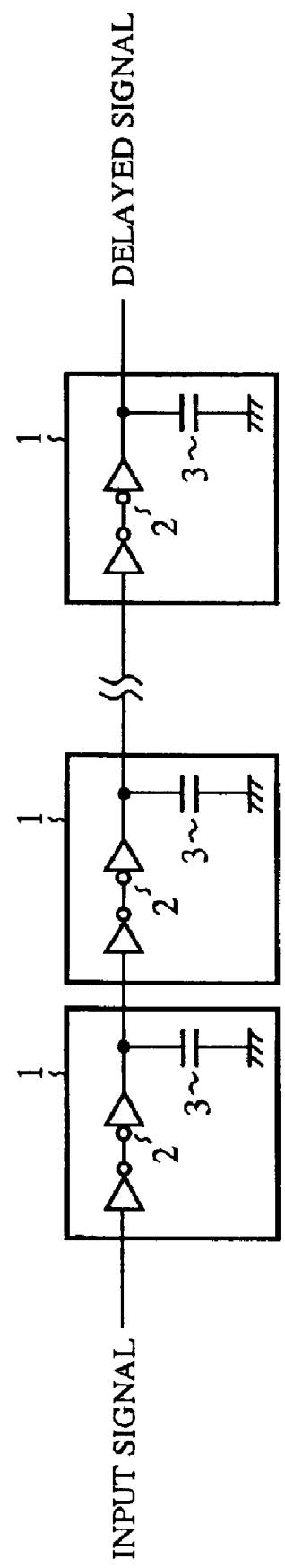
FIG. 8 is a schematic circuit diagram showing the structure of a prior art delayed signal generation circuit.

For example, each delay element 11 included in the first delay circuit has the same structure as each delay element as shown in FIG. 8, and each delay element 12 included in the second delay circuit also has the same structure as each delay element as shown in FIG. 8. Therefore, when a power supply voltage supplied to each delay element 11 and each delay element 12 or the operating temperature changes, the operation characteristics of each delay element 11 change in the same manner that the operation characteristics of each delay element 12 change. Assume that in the first embodiment a time delay provided for an input signal by each delay element 12 is two times as large as that provided for an input signal by each delay element 11.

The latch circuit 13 and the determination circuit 14 detect the number of delay elements 11 that have made a "Low" to "High" transition during the interval that the reference clock is at a "High" state in cooperation with each other, so that the selector 15 selects a delay element 12 from among the plurality of delay elements included in the second delay circuit according to the detected number of delay elements 11. At that time, the period of the reference clock is maintained constant and the pulse duration of the reference clock is also maintained constant regardless of changes in the power supply voltage and/or the operating temperature. In other words, the interval during which the latch circuit 13 and the determination circuit 14 detect the number of delay elements 11 that make a "Low" to "High" transition in their contents remains constant regardless of changes in the power supply voltage and/or the operating temperature. As a result, the delayed signal generation circuit can generate a delayed signal B that is delayed by a predetermined time interval with respect to the input signal A, the predetermined time interval being constant regardless of changes in the power supply voltage and/or the operating temperature, by establishing correspondences between the number of delay elements 11 detected by the latch circuit 13 and the determination circuit 14, and one delay element 12 included in the second delay circuit.

Figure 2:
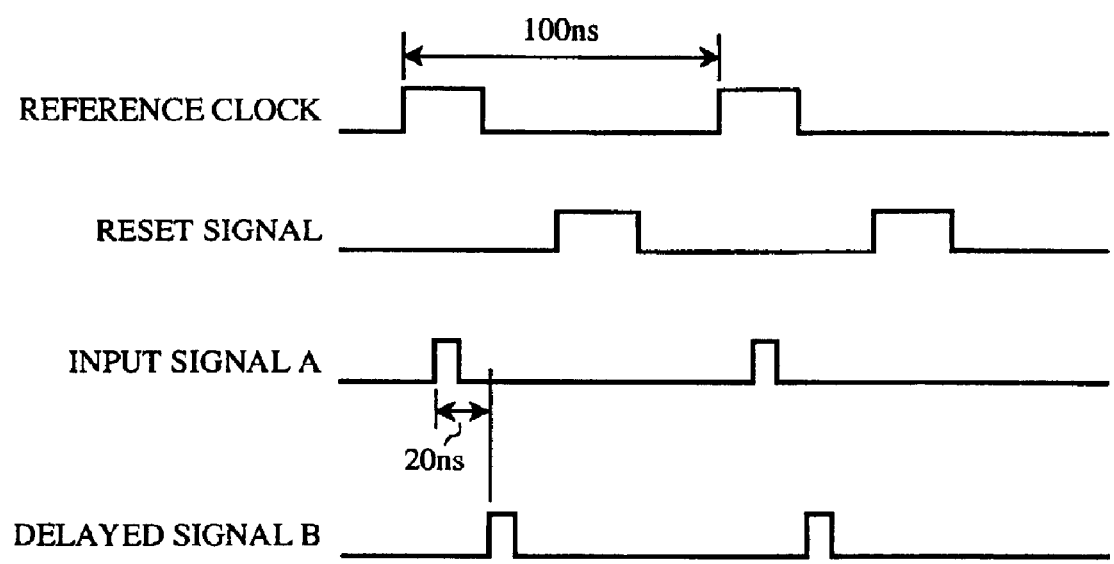
FIG. 2 is a diagram showing the logical values of various signals in the delayed signal generation circuit according to the first embodiment.

For simplicity, assume that 1 cycle of the reference clock is 100 nsec and the delayed signal B that is delayed by 20 nsec with respect to the input signal A needs to be output from the selector 15, as shown in FIG. 2. Furthermore, assume that when the power supply voltage is 3 Volts, the first to tenth delay elements 11 included in the first delay circuit make a "Low" to "High" transition in their contents and all other delay elements 11 remain at a "Low" state during the interval that the reference clock is at a "High" state, whereas when the power supply voltage is 2 Volts, the first to eighth delay elements 11 make a "Low" to "High" transition in their contents and all other delay elements 11 remain at a "Low" state during the interval that the reference clock is at a "High" state.

When the delayed signal generation circuit operates on the power supply of 3 Volts, the plurality of delay elements 11 make a "Low" to "High" transition in their contents in rotation in the order in which they are running from the input side to the output side every time the reference clock rises. The latch circuit 13 then latches the contents of each of the plurality of delay elements 11 when the reference clock falls. In this case, since the power supply voltage is 3 Volts, the contents of each of the first to tenth delay elements 11 are "High" and the contents of each of the 11th to Nth delay elements 11 are "Low".

Every time the reset signal rises, the determination circuit 14 determines the number of delay elements 11 that make a "Low" to "High" transition in their contents during the interval that the reference clock is at a "High" state from the contents of the latch circuit 13, and then outputs a control signal having a value corresponding to the determined number of delay elements 11 to the selector 15. The contents of the latch circuit 13 are cleared when the reset signal falls. That is, the determination circuit 14 stores a correspondence between the number of delay elements 11 that make a "Low" to "High" transition in their contents during the interval that the reference clock is at a "High" state and one delay element 12 included in the second delay circuit to be selected. For example, if the number of delay elements 11 make a "Low" to "High" transition in their contents during the interval that the reference clock is at a "High" state is 10, the one delay element 12 to be selected is the fifth delay element, and if the number of delay elements 11 that make a "Low" to "High" transition in their contents during the interval that the reference clock is at a "High" state is 8, the one delay element 12 to be selected is the fourth delay element. Therefore, in the example of FIG. 2, the determination circuit 14 outputs a control signal that directs the selector 15 to select the fifth delay element 12 to the selector 15.

When the selector 15 receives the control signal from the determination circuit 14, the selector 15 selects one delay element 12 according to the control signal and furnishes an output signal from the selected delay element 12 as the delayed signal B. In this example, since the selector 15 receives the control signal that directs the selector to select the fifth delay element 12, it outputs an output signal output from the fifth delay element 12 as the delayed signal B.

Next, the description is directed a case where the power supply voltage decreases to 2 Volts because of battery drain or the like. Even when the delayed signal generation circuit operates on the power supply of 2 Volts, the plurality of delay elements 11 make a "Low" to "High" transition in their contents in rotation in the order in which they are running from the input side to the output side every time the reference clock rises. The latch circuit 13 then latches the contents of each of the plurality of delay elements 11 every time the reference clock falls. In this case, since the power supply voltage is 2 Volts, the contents of each of the first to eighth delay elements 11 are "High" and the contents of each of the ninth to Nth delay elements 11 are "Low".

Every time the reset signal rises, the determination circuit 14 determines the number of delay elements 11 that make a "Low" to "High" transition in their contents during the interval that the reference clock is at a "High" state from the contents of the latch circuit 13, and then outputs a control signal having a value corresponding to the determined number of delay elements 11. The contents of the latch circuit 13 are cleared every time the reset signal falls. Therefore, in the example of FIG. 2, since the number of delay elements 11 that make a "Low" to "High" transition in their contents during the interval that the reference clock is at a "High" state is 8, the determination circuit 14 outputs a control signal that directs the selector 15 to select the fourth delay element 12 to the selector 15.

When the selector 15 receives the control signal from the determination circuit 14, the selector 15 selects a delay element 12 according to the control signal and outputs an output signal from the selected delay element 12 as the delayed signal B. In this example, since the selector 15 receives the control signal that directs the selector to select the fourth delay element 12, it outputs an output signal from the fourth delay element 12 as the delayed signal B.

As previously mentioned, in accordance with the first embodiment of the present invention, the delayed signal generation circuit is so constructed as to determine the number of delay elements 11 that make a "Low" to "High" transition state in their contents during the interval that the reference clock is at a "High" state from the contents of the latch circuit 13, and to output a control signal having a value corresponding to the determined number of delay elements 11 to the selector 15. Accordingly, the delayed signal generation circuit can generate a delayed signal B that is delayed by a constant time interval with respect to an input signal A even if the power supply voltage supplied to each delay element 11 and each delay element 12 changes. In the first embodiment shown, the delayed signal generation circuit can also generate a delayed signal B that is delayed by a constant time interval with respect to an input signal A in the same manner even if the operating temperature changes.

Embodiment 2.

Figure 3:
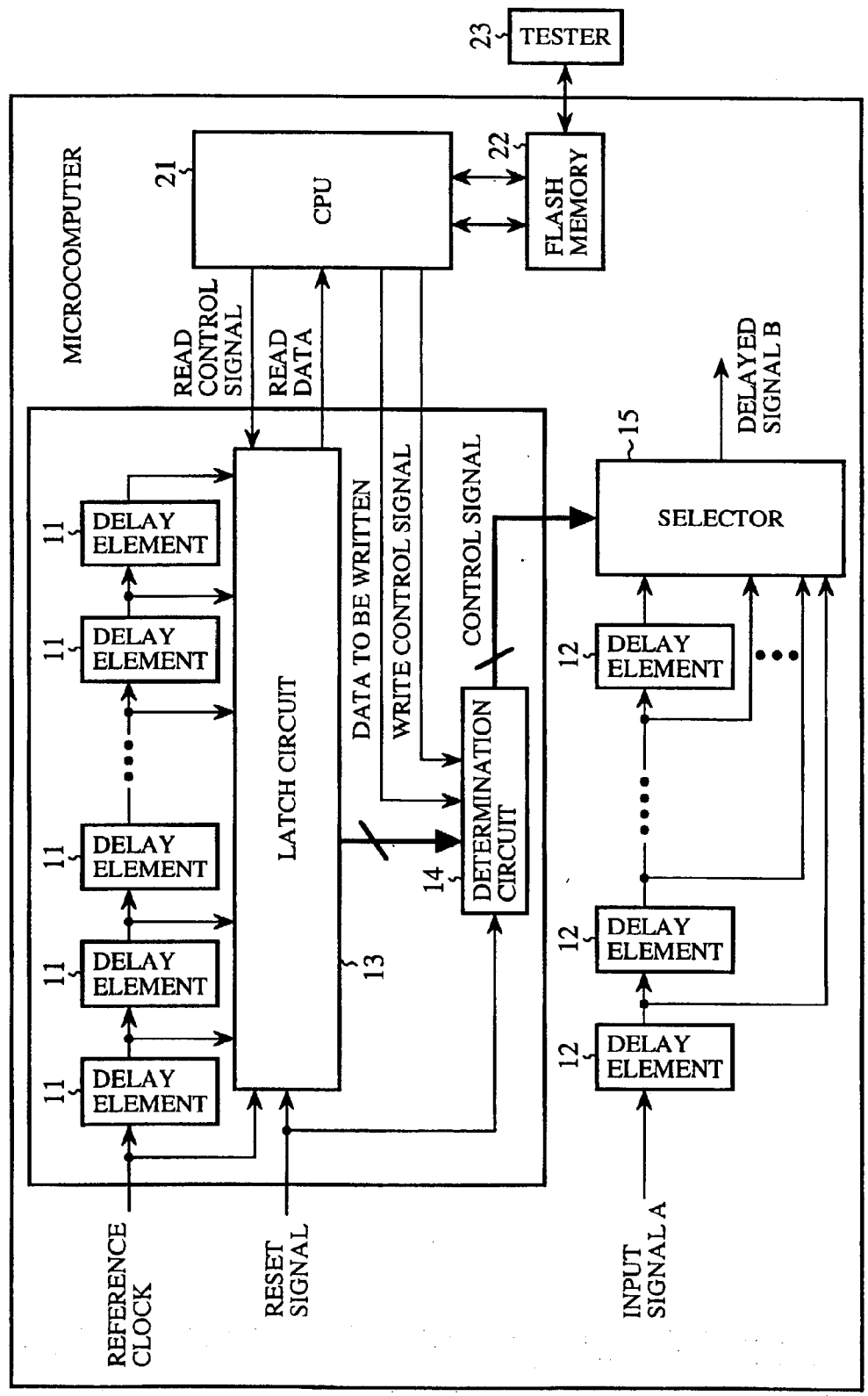
FIG. 3 is a block diagram showing the structure of a delayed signal generation circuit according to a second embodiment of the present invention.

FIG. 3 is a block diagram showing the structure of a delayed signal generation circuit according to a second embodiment of the present invention. In the figure, since the same reference numerals as shown in FIG. 1 denote the same components as those of the first embodiment or like components, the explanation of those components will be omitted hereafter. Reference numeral 21 denotes a CPU for, when a power supply voltage of 3 Volts is supplied to a microcomputer, into which the delayed signal generation circuit is incorporated, from an external tester 23 disposed outside the microcomputer at the time of production test, for example, furnishing the contents of a latch circuit 13 to the tester 23 by writing the contents of the latch circuit 13 in a flash memory 22, and for, when the external tester 23 writes a reset vector (i.e. a correspondence between the number of delay elements 11 that make a "Low" to "High" transition state in their contents during the interval that a reference clock applied to a first delay circuit is at a "High" state and a delay element 12 to be selected by a selector 15, which is to be stored in a determination circuit 14) which indicates a reference number specific to the microcomputer in the flash memory 22, writing the reset vector in the determination circuit 14. The reference number is the number of delay elements 11 that make a "Low" to "High" transition state in their contents during the interval that the reference clock is at a "High" state when the power supply voltage from the tester 23 is 3 Volts. The flash memory 22 stores the contents of the latch circuit 13 and the reset vector. The tester 23 calculates the reset vector from the contents of the latch circuit 13.

The above-mentioned first embodiment does not refer to the setting of a correspondence and changing of a correspondence stored in the determination circuit 14. However, since the switching characteristics of delay elements 11 and 12 installed in the microcomputer are not necessarily invariant due to variations in the manufacturing processes, it is necessary to set a proper correspondence to the determination circuit 14 as required. So, in accordance with the second embodiment, to generate a delayed signal B that is delayed by a constant time interval with respect to an input signal A even if there are variations in the manufacturing processes, the CPU 21 sets a proper correspondence between the number of delay elements 11 of the first delay circuit which is determined by the determination circuit 14, and one delay element of the second delay circuit which is to be selected by the selector 15 in the determination circuit 14 or changes the correspondence stored in the determination circuit 14 based on the contents of the latch circuit 13 at the time of a production test or a reset of the microcomputer.

Concretely, at the time of a production test or a reset of the microcomputer, the external tester 23 supplies a power supply voltage (for example, a voltage of 3 Volts), on which the microcomputer operates under normal operating conditions, to the microcomputer. After that, when the reference clock falls, the CPU 21 reads the contents of the latch circuit 13 and furnishes the contents of the latch circuit to the external tester 23 by writing the contents of the latch circuit in the flash memory 22.

The external tester 23 reads the contents of the latch circuit 13 from the flash memory 22 and measures a time interval by which a delayed signal output from each delay element 12 is delayed. The external tester 23 then calculates a reset vector (a correspondence to be stored in determination circuit 14) from measurement results and the contents of the latch circuit, and stores the reset vector in the flash memory 22. The CPU 21 then reads the reset vector from the flash memory 22, and performs a process of writing the reset vector in the determination circuit 14. Similarly, the external tester 23 can supply a power supply voltage of 2 Volts to the microcomputer, for example, and then calculate a reset vector associated with the power supply voltage that thus decreases to 2 Volts, so that the CPU 21 can perform a process of writing the reset vector in the determination circuit 14.

Embodiment 3.

Figure 4:
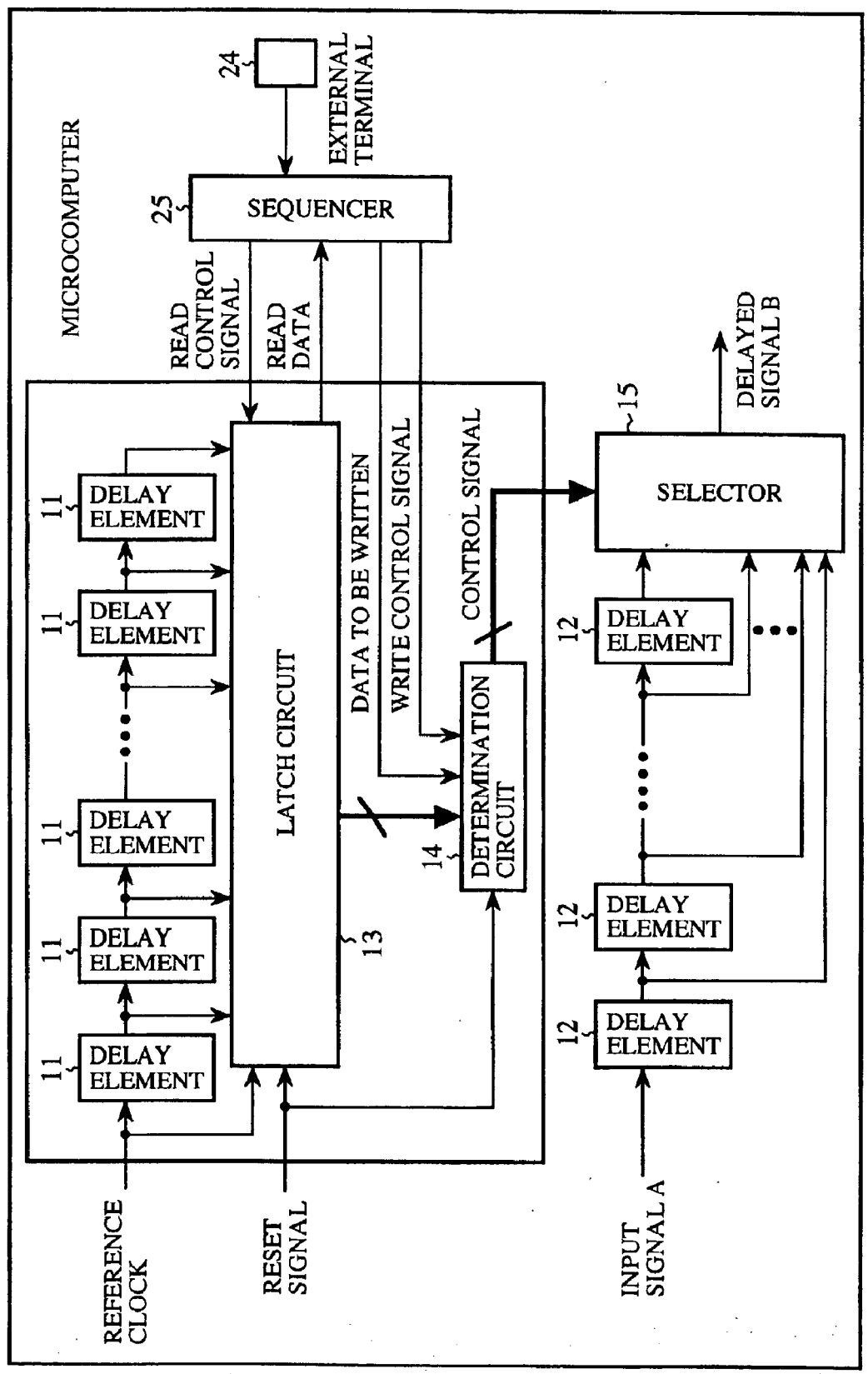
FIG. 4 is a block diagram showing the structure of a delayed signal generation circuit according to a third embodiment of the present invention.

In the above-mentioned second embodiment, the external tester 23 calculates a-reset vector and the CPU 21 writes the reset vector in the determination circuit 14. In accordance with a third embodiment of the present invention, a sequencer 25 having the same functions as the CPU 21 and the tester 23 of the second embodiment calculates a reset vector and writes the reset vector in the determination circuit 14 in response to a trigger signal applied thereto by way of an external terminal 24, as shown in FIG. 4. As a result, even if no flash memory is built in the microcomputer, the reset vector can be written in the determination circuit 14.

Embodiment 4.

Figure 5:
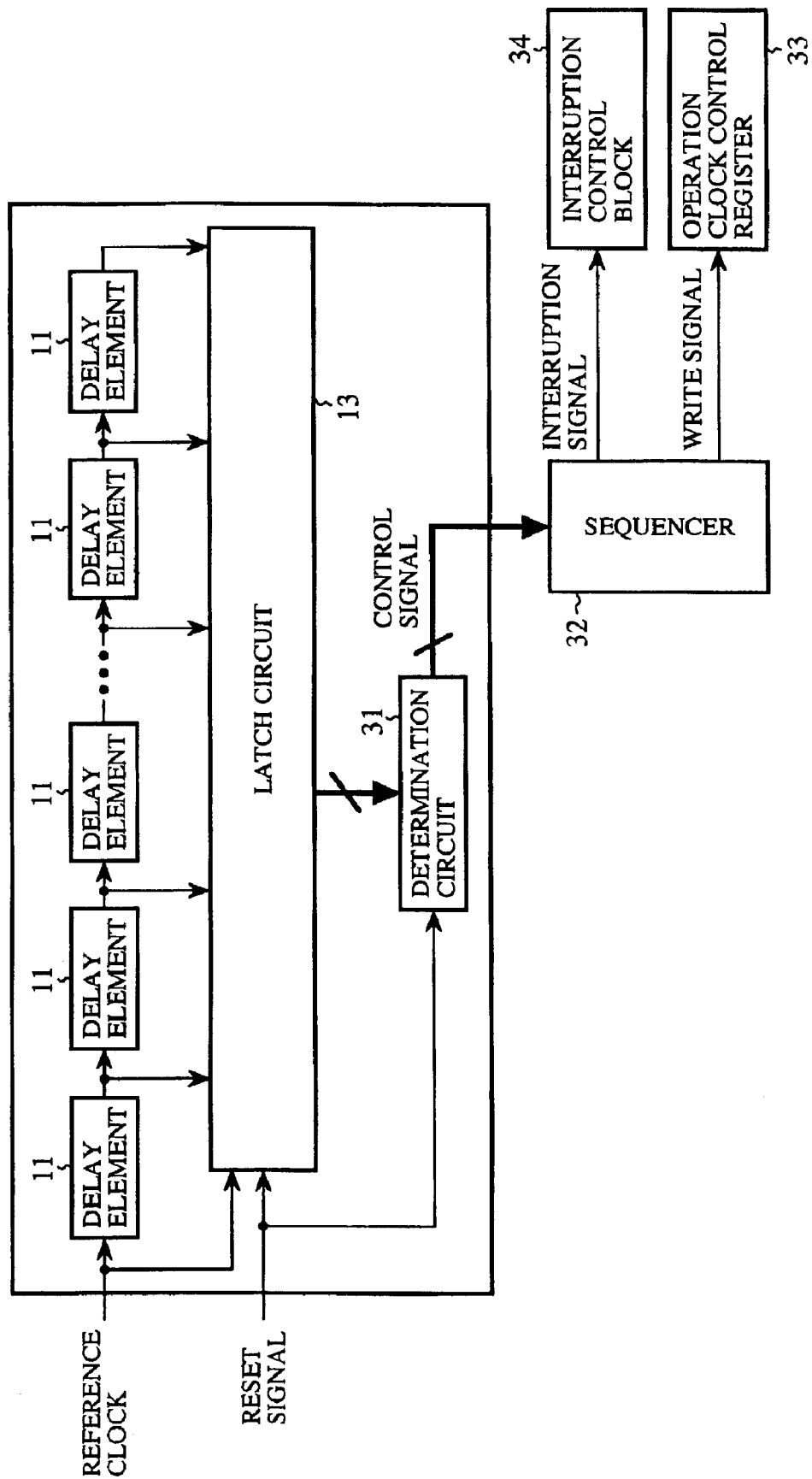
FIG. 5 is a block diagram showing the structure of a delayed signal generation circuit according to a fourth embodiment of the present invention.

FIG. 5 is a block diagram showing the structure of a delayed signal generation circuit according to a fourth embodiment of the present invention. In the figure, since the same reference numerals as shown in FIG. 1 denote the same components as those of the first embodiment or like components, the explanation of those components will be omitted hereafter. Reference numeral 31 denotes a determination circuit that has the same function as the determination circuit 14 mentioned above, and that, when the number of delay elements 11 included in a first delay circuit that make a "Low" to "High" transition in their contents during the interval that a reference clock is at a "High" state is less than a reference number of delay elements 11, outputs a control signal indicating the fact, reference numeral 32 denotes a sequencer (i.e., frequency control means) for outputting a write signal that directs reduction of the frequency of a clock supplied to each of a plurality of delay elements (not shown) included in a second delay circuit (not shown) in response to the control signal from the determination circuit 31, and for outputting an interruption signal that informs an interruption control block 34 of a decrease in the power supply voltage, and reference numeral 33 denotes an operation clock control register for reducing the frequency of the clock in response to the write signal from the sequencer 32. The interruption control block 34 gives an alarm indicating a decrease in the power supply voltage and provides an instruction for saving of the contents of a RAM in response to the interruption signal from the sequencer 32. A selector 15 is not shown in FIG. 5.

In operation, when the number of delay elements 11 that make a "Low" to "High" transition in their contents during the interval that the reference clock is at a "High" state is less than the reference number, the delayed signal generation circuit according to the fourth embodiment can reduce the frequency of the clock supplied to each of the plurality of delay elements (not shown) included in the second delay circuit (not shown). Concretely, since when the power supply voltage becomes less than an acceptable voltage because of battery drain or the like, the number of delay elements 11 that make a "Low" to "High" transition in their contents during the interval that the reference clock is at a "High" state becomes less than the reference number and therefore the correct functioning of each of the plurality of delay elements (not shown) included in the second delay circuit (not shown) is not ensured, the determination circuit 31 outputs the control signal indicating that the number of delay elements 11 that make a "Low" to "High" transition in their contents during the interval that the reference clock is at a "High" state is less than the reference number to the sequencer 32.

In response to the control signal from the determination circuit 31, the sequencer 32 reduces the frequency of the clock so as to secure a low voltage margin by outputting the write signal that directs the reduction of the frequency of the clock supplied to each of the plurality of delay elements (not shown) included in the second delay circuit (not shown) to the operation clock control register 33. In response to the control signal from the determination circuit 31, the sequencer 32 outputs an interruption signal that informs the interruption control block 34 of a decrease in the power supply voltage to the interruption control block 34, so that the interruption control block 34 can give an alarm indicating a decrease in the power supply voltage and can provide an instruction for saving of the contents of a RAM.

Embodiment 5.

Figure 6:
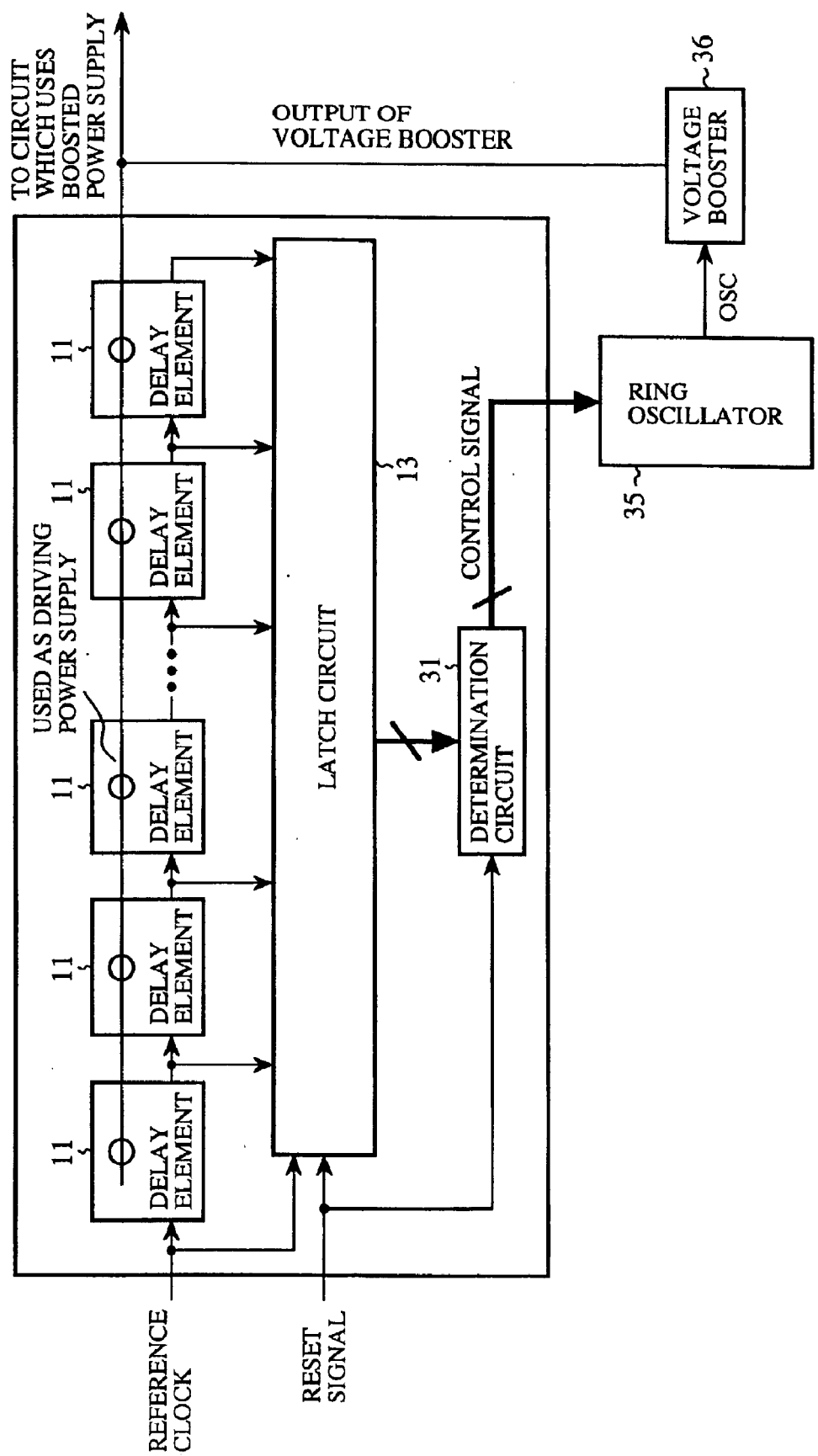
FIG. 6 is a block diagram showing the structure of a delayed signal generation circuit according to a fifth embodiment of the present invention.

FIG. 6 is a block diagram showing the structure of a delayed signal generation circuit according to a fifth embodiment of the present invention. In the figure, since the same reference numerals as shown in FIG. 5 denote the same components as those of the fourth embodiment or like components, the explanation of those components will be omitted hereafter. Reference numeral 35 denotes a ring oscillator for generating a clock OSC to cause a voltage booster 36 to perform a pumping operation in response to a control signal from a determination circuit 31. The voltage booster 36 performs a pumping operation so as to raise a power supply voltage in response to the clock OSC from the ring oscillator 35. Delay elements 12 and a selector 15 are not shown in FIG. 6.

In operation, when the number of delay elements 11 included in a first delay circuit that make a "Low" to "High" transition in their contents during the interval that the reference clock is at a "High" state becomes less than a reference number, the delayed signal generation circuit of the fifth embodiment can raise the power supply voltage. Concretely, when the power supply voltage decreases to 3 Volts or less and therefore the number of delay elements 11 that make a "Low" to "High" transition in their contents during the interval that the reference clock is at a "High" state becomes less than the reference number, the determination circuit 31 outputs a control signal indicating the fact to the ring oscillator 35.

In response to the control signal from the determination circuit 31, the ring oscillator 35 generates the clock OSC to cause the voltage booster 36 to perform a pumping operation. The voltage booster 36 then performs a pumping operation so as to raise the power supply voltage in response to the clock OSC from the ring oscillator 35. When the supply of the clock OSC is stopped, the voltage booster 36 stops the pumping operation.

When the power supply voltage is thus raised, the boosted power supply is consumed by a circuit that uses the boosted power supply and the power supply voltage then decreases gradually. When the power supply voltage becomes 3 Volts or less again, the ring oscillator 35 generates the clock OSC again in the same way.

Embodiment 6.

Figure 7:
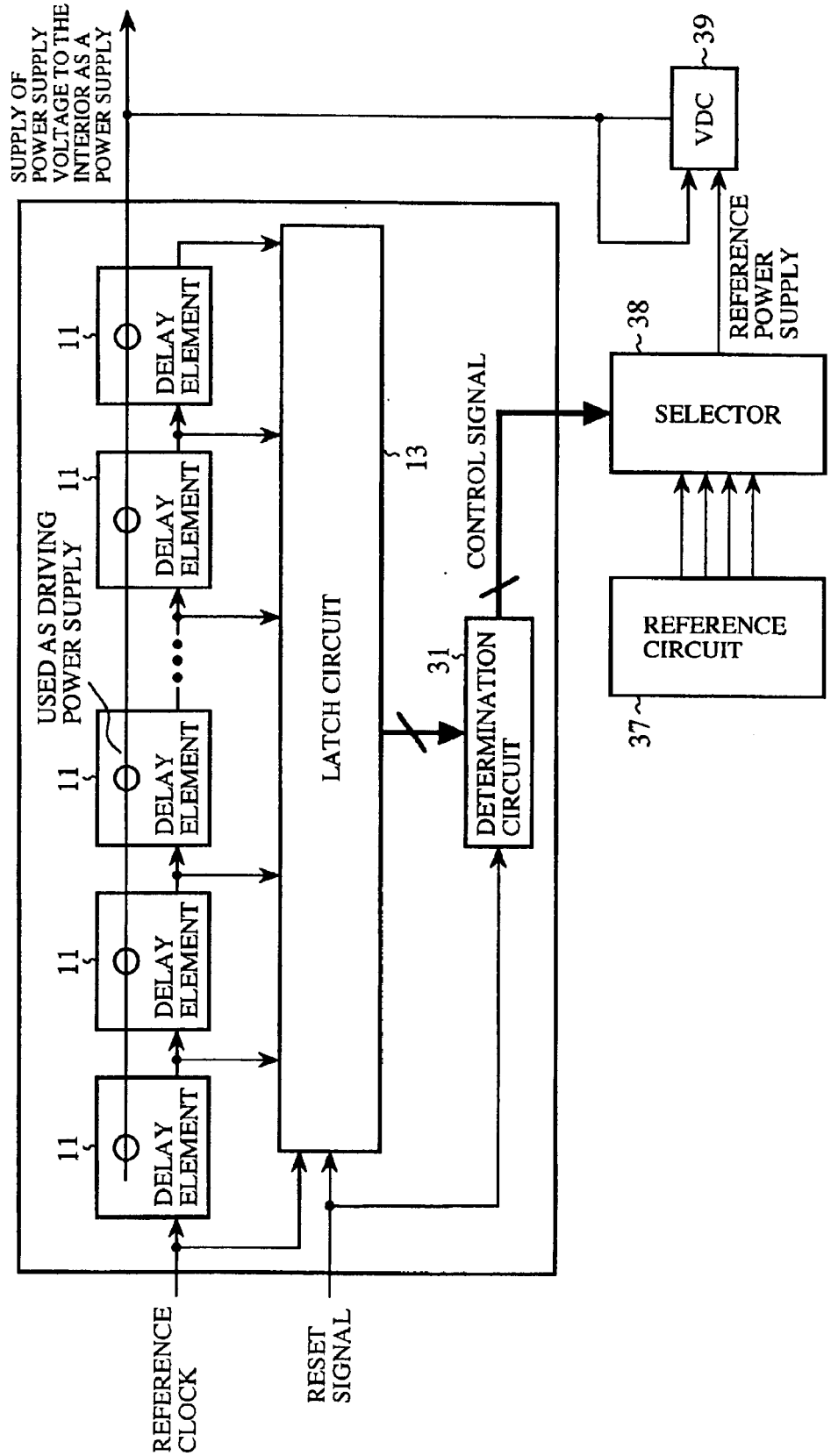
FIG. 7 is a block diagram showing the structure of a delayed signal generation circuit according to a sixth embodiment of the present invention.

FIG. 7 is a block diagram showing the structure of a delayed signal generation circuit according to a sixth embodiment of the present invention. In the figure, since the same reference numerals as shown in FIG. 5 denote the same components as those of the fourth embodiment or like components, the explanation of those components will be omitted hereafter. Reference numeral 37 denotes a reference generation circuit for generating a plurality of different reference voltages, reference numeral 38 denotes a selector for selecting a reference voltage from among the plurality of different reference voltages according to a control signal applied thereto for indicating the number of delay elements 11 included in a first delay circuit that make a "Low" to "High" transition in their contents during the interval that the reference clock is at a "High" state from a determination circuit 31, and reference numeral 39 denotes a VDC for comparing the reference voltage selected by the selector 38 with a power supply voltage, and for controlling the power supply voltage according to a comparison result. Delay elements 12 and a selector 15 are not shown in FIG. 7.

In operation, when the number of delay elements 11 that make a "Low" to "High" transition in their contents during the interval that the reference clock is at a "High" state becomes less than a reference number, the delayed signal generation circuit according to the sixth embodiment selects a reference voltage from among the plurality of different reference voltages according to the number of delay elements 11 that make a "Low" to "High" transition in their contents during the interval that the reference clock is at a "High" state and controls the power supply voltage based on the reference voltage, instead of raising the power supply voltage. Concretely, the reference generation circuit 37 generates a reference voltage of 2 Volts, a reference voltage of 1.5 Volts, and a reference voltage of 1 Volt, for instance. For example, when the number of delay elements 11 that make a "Low" to "High" transition in their contents during the interval that the reference clock is at a "High" state is 8, the selector 38 selects the first reference voltage of 2 Volts, when the number of delay elements 11 that make a "Low" to "High" transition in their contents during the interval that the reference clock is at a "High" state is 10, the selector 38 selects the second reference voltage of 1.5 Volts, and when the number of delay elements 11 that make a "Low" to "High" transition in their contents during the interval that the reference clock is at a "High" state is 12, the selector 38 selects the third reference voltage of 1 Volt.

Then, when the selector 38 selects the first reference voltage of 2 Volts, the VDC 39 controls the power supply voltage so that the power supply voltage becomes 3.5 Volts. When the selector 38 selects the second reference voltage of 1.5 Volts, the VDC 39 controls the power supply voltage so that the power supply voltage becomes 3 Volts. When the selector 38 selects the third reference voltage of 1 Volt, the VDC 39 controls the power supply voltage so that the power supply voltage becomes 2.5 Volts. As a result, even if the operating temperature changes, the delayed signal generation circuit can keep the power supply voltage constant.

Many widely different embodiments of the present invention may be constructed without departing from the spirit and scope of the present invention. It should be understood that the present invention is not limited to the specific embodiments described in the specification, except as defined in the appended claims.

What is claimed is:

1. A delay signal generation circuit comprising:

a first delay circuit, having a plurality of delay elements connected in series, for delaying a reference signal input thereto and for outputting the delayed reference signal;

a second delay circuit, having a plurality of delay elements connected in series, for delaying a signal input thereto and for outputting the delayed input signal;

detection means for detecting, in response to the reference signal applied to said first delay circuit, a number of delay elements of said first delay circuit which are in a given state after a lapse of a predetermined time interval;

a selection means for storing correspondency data between the number of delay elements of said first delay circuit which is detected by said detection means, and one delay element of said second delay circuit which is to be selected, and for selecting any delay element from among the plurality of delay elements of said second delay circuit based on the correspondency data; and setting-changing means for setting and changing the correspondency data stored in said selection means.

2. The delay signal generation circuit according to claim 1, further comprising a means for raising a power supply voltage when the number of delay elements detected by said detector means is less than a reference number.

3. The delay signal generation circuit according to claim 1, further comprising a means for controlling a power supply voltage according to the number of delay elements detected by said detection means.

4. A delay signal generation circuit comprising:

a first delay circuit, having plurality of delay elements connected in series, for delaying a reference signal input thereto and for outputting the delayed reference signal;

a second delay circuit, having a plurality of delay elements connected in series, for delaying a signal input thereto and for outputting the delayed input signal:

detection means for detecting, in response to the reference signal applied to said first delay circuit, a number of delay elements of said first delay circuit which are in a given state after a lapse of a predetermined time interval; and frequency control means for reducing a frequency of a clock supplied to said plurality of delay elements of said second delay circuit when the number of delay elements of said first delay circuit detected by said detection means is less than a reference number of delay elements, and for outputting an interruption signal that informs a decrease in a power supply voltage.

* * * * *